United States Patent [19]

Azuma et al.

[11] Patent Number: 5,708,302
[45] Date of Patent: Jan. 13, 1998

[54] BOTTOM ELECTRODE STRUCTURE FOR DIELECTRIC CAPACITORS

[75] Inventors: Masamichi Azuma; Carlos A. Paz De Araujo; Joseph D. Cuchiaro, all of Colorado Springs, Colo.

[73] Assignees: Symetrix Corporation, Colorado Springs, Colo.; Matsushita Electronics Corporation, Japan

[21] Appl. No.: 427,897

[22] Filed: Apr. 26, 1995

[51] Int. Cl.⁶ ............................ H01L 23/48
[52] U.S. Cl. .................. 257/751; 257/763; 257/753
[58] Field of Search .................. 257/751, 769, 257/763, 753, 310

[56] References Cited

U.S. PATENT DOCUMENTS 4,300,149  11/1981  Howard et al. ............... 257/751
5,046,043  9/1991  Miller et al. ............... 257/753

OTHER PUBLICATIONS

Scott et al., "Integrated Ferroelectrics," Condensed Matter News, vol. 1, No. 3, p. 66 1992.
Smolenskii et al., "Ferroelectrics of the Oxygen–Octahedral Type with Layered Structure," Soviet Physics—Solid State, v. 3, N. 3, Sep. 1961, 651.

*Primary Examiner*—Jerome Jackson
*Assistant Examiner*—Nathan K. Kelley
*Attorney, Agent, or Firm*—Duft, Graziano & Forest, P.C.

[57] ABSTRACT

An integrated circuit capacitor (20) includes a bottom electrode structure (24) having an adhesion metal portion (34), a noble metal portion (36), and a second noble metal layer (40). A process of manufacture includes annealing the adhesion metal portion (34) and the noble metal portion (36) prior to the deposition of second noble metal layer (40) for purposes of forming barrier region (38). The electrode (24) preferably contacts metal oxide layer (26), which is made of a perovskite or perovskite-like layered superlattice material. A temporary capping layer (59) is formed and removed in manufacture, which serves to increase polarization potential from the device by at least 40%.

20 Claims, 5 Drawing Sheets

BOTTOM ELECTRODE STRUCTURE FOR DIELECTRIC CAPACITORS

BACKGROUND OF THE INVENTION

1. Field of the Invention

The present invention pertains to the field of wiring layers for integrated circuit devices and, more particularly, electrodes including diffusion barrier layers, as well as methods of making the same. More specifically, the diffusion barrier layers are preferably used in the electrodes of dielectric capacitors or ferroelectric capacitors.

2. Description of the Prior Art

Integrated circuit devices can fail or suffer performance degradation due to materials incompatibility problems. Thin-film layers can be contaminated by diffusion from adjacent layers. Additionally, cracking, peeling, and surface irregularity problems can derive from different thermal coefficients of expansion in the respective layers, as it is often necessary to heat the devices in manufacture. These problems are intensified by the micro-thin nature of the circuit layers because it is impossible to predict the thermal performance of a given layer without also considering the substrate on which the layer is formed. Accordingly, circuit designers must carefully select the materials that will form the respective thin-film layers.

A common circuit failure mechanism includes shorting that is induced by the cracking or peeling of one thin-film layer away from another layer due to poor bonding between the adjacent layers. In silicon technology devices, a platinum wiring layer or electrode can bond poorly with a silicon dioxide or titanium dioxide isolation layer that separates the platinum electrode from the silicon wafer. Researchers have successfully reduced the incidence of cracking by applying a titanium metal adhesion layer to the isolation layer prior to sputtering the platinum electrode; however, the application of titanium metal proved to be problematic. The additional titanium served to contaminate other layers through titanium diffusion. Diffused titanium contamination is particularly problematic in integrated circuits because the titanium cations typically present a variety of valence states, i.e., +2, +3, and +4, which induce corresponding lattice defects. Metal nitride diffusion barrier layers have been constructed to isolate the adhesion layer metals. See for example the U.S. Pat. No. to Larson, 5,005,102, and Garceau et al, "TiN As A Diffusion Barrier Layer In The Ti-Pt-Au Beam Less Metal System", 60 Thin Solid Films, 237–247, No. 2, (1979), which both teach the use of a titanium nitride diffusion barrier layer. Annealing of metal nitrides can yield surface irregularities, e.g., hillocks, that induce shorting of dielectric or ferroelectric capacitors.

There remains a need for an effective bottom electrode structure that adheres well and does not have short-inducing surface irregularities. Additionally, in silicon technology devices, prior barrier layers have not proven to be effective against the diffusion or blooming of silicon or silicon dioxide, which can significantly degrade the performance of high-dielectric capacitors.

SOLUTION TO THE PROBLEM

The present invention overcomes the problems that are outlined above by providing an electrode structure including a diffusion barrier layer and electrode which is substantially free of surface irregularities. The barrier layer is effective in preventing or reducing adhesion metal diffusion and silicon diffusion or blooming even in the absence of a metal nitride. The barrier layer is produced according to a special process that includes interdiffusing an adhesion metal portion and a noble metal portion to provide a particularly stable barrier region lattice, and capping the lattice with a temporary metal oxide or spin-on glass ("SOG") layer. The temporary layer is removed, and a relatively pure or undiffused noble metal is applied to complete the electrode and barrier region.

Ferroelectric capacitor devices including an electrode having this type of bottom electrode structure exhibit up to a 100% or greater improvement in polarization as compared to devices that are made of identical ingredients which have not been subjected to special processing. The barrier layer also imparts notable performance improvements to dielectric capacitors.

The present invention includes an electrode structure having a diffusion barrier region that is formed of interdiffused metals. The barrier-containing electrode structure is particularly useful in integrated circuit devices, such as thin-film ferroelectric capacitors and dielectric capacitors. The barrier region is formed of an adhesion metal portion and a noble metal portion that are at least partially interdiffused with one another, e.g., by simultaneously annealing the respective portions to at least partially combine them.

The temporary layer formed of SOG or a metal oxide is formed atop the barrier region, and may be annealed simultaneously together with the barrier region. During the anneal, the adhesion metal diffuses throughout the barrier region and the temporary layer. An abrupt change in adhesion metal flux, in addition to that which would normally occur at layer boundaries, is subsequently caused by the removal of the temporary layer. The electrode is completed by covering or capping the barrier layer with a noble metal layer.

The barrier region presents a first average flux of a diffusible moiety selected from a group consisting of adhesion metal moieties, substrate moieties, and mixtures thereof. The noble metal layer presents a second average flux less than the first average flux of the diffusible moiety. The change in flux derives from the removal of a temporary layer that receives adhesion metal moieties prior to stabilization of the barrier region lattice. The electrode is supported by a substrate, and may be covered with additional layers such as dielectric or ferroelectric materials.

In preferred forms of the invention, the substrate is a silicon substrate, but may also be any other substrate. The noble metal portion of the barrier region and the noble metal of the noble metal layer are preferably the same type of noble metal, and are most preferably platinum. The adhesion metal is preferably titanium or tantalum. The noble metal portion of the barrier region is preferably applied in a thickness ranging from about three to eight times the thickness of the adhesion metal portion.

Especially preferred forms of the invention include an integrated circuit capacitor device. The capacitor includes a metal oxide layer deposited atop the noble metal layer of the completed barrier-electrode. The metal oxide layer is preferably formed of a material that is selected from a group consisting of ferroelectric metal oxides, high dielectric metal oxides having a dielectric constant greater than or equal to that of silicon dioxide, and combinations thereof. Ferroelectric metal oxides are particularly preferred. A top electrode is deposited over the metal oxide layer to complete the capacitor.

In the case of high dielectric capacitors, the metal oxide material is preferably a perovskite having an empirical formula of $ABO_3$, wherein A is an A-site metal cation, B is a B-site metal cation, and O is oxygen. The most preferred type of perovskite is barium strontium titanate ("BST"), which may be either ferroelectric or non-ferroelectric depending upon the relative amounts of structurally equivalent A-site barium and strontium metals. Even though both types of BST typically have high dielectric constants that exceed the dielectric constant of silicon dioxide, the use of non-ferroelectric BST is preferred for use as a dielectric. The barrier layer serves to keep the BST essentially free from diffused moieties of silicon and silicon dioxide. These diffused silicon moieties would, otherwise, migrate to the BST layer and degrade the dielectric performance. The most preferred BST formulation has an average empirical formula of $Ba_{0.7}Sr_{0.3}TiO_3$.

In ferroelectric capacitors, the metal oxide material is preferably a perovskite-like layered superlattice material. The term "perovskite-like" refers to a lattice that is formed of respective oxygen octahedra layers that are separated by superlattice generator layers including a trivalent metal such as bismuth. These materials are recognized as a broad class of ferroelectric materials, but have not historically been successfully applied in integrated circuit devices due to device reliability problems. The perovskite-like portion of the layered superlattice material is formed in discrete layers. These layers include a primary cell having an oxygen octahedral positioned within a cube that is defined by large A-site metals at the corners. The oxygen atoms occupy the planar face centers of the cube and a small B-site element occupies the center of the cube. In some instances, the oxygen octahedral structure may be preserved in the absence of A-site elements.

The most preferred layered superlattice material is strontium bismuth tantalate material having an average empirical formula of $SrBi_2Ta_2O_9$. The superlattice-generator layers are most preferably formed of $(Bi_2O_2)^{2+}$ materials, but may also contain thallium (III) as the metal. The most preferred oxygen octahedra structure layers, accordingly, have an average empirical formula of $(SrTa_2OT)^{2-}$. The respective layers spontaneously generate a layered superlattice upon annealing of a metal organic precursor solution. The oxygen octahedra layers are ferroelectric and have an average empirical formula with an ionic charge that is offset by the superlattice generator layers to balance the overall crystal charge. The barrier layer serves to keep the layered superlattice material essentially free of adhesion metals, which can degrade polarization by inducing point defects.

A preferred method exists for producing the thin-film barrier-containing electrode devices. The adhesion metal portion is deposited on a substrate, and a first noble metal portion is applied on the adhesion metal portion. Both the adhesion metal and the noble metal are preferably deposited by sputtering. A temporary metal oxide or SOG coating, e.g., $SiO_2$ or $SrBi_2Ta_2O_9$, is deposited atop the electrode structure. The temporary layer is subjected to a first anneal, and removed by etching to leave a bottom electrode having a barrier region that includes interdiffused adhesion and noble metal moieties. A second noble metal layer is preferably sputtered atop the barrier region. A dielectric or ferroelectric metal oxide layer is deposited on the second noble metal portion, and the combined layers are subjected to a second anneal.

Especially preferred methods include annealing the barrier region and the temporary metal oxide coating together at a temperature ranging from about 450° to 850° C. The most preferred anneal temperature is 600° C. A second noble metal layer is deposited after the temporary layer or coating has been removed, and a second metal oxide layer is then preferably formed on the second noble metal layer. The most preferred method of forming the respective metal oxide layers includes depositing a liquid precursor to form a precursor film, and heating the precursor film to yield the metal oxide.

DETAILED DESCRIPTION OF THE PREFERRED EMBODIMENT

Figure 1:
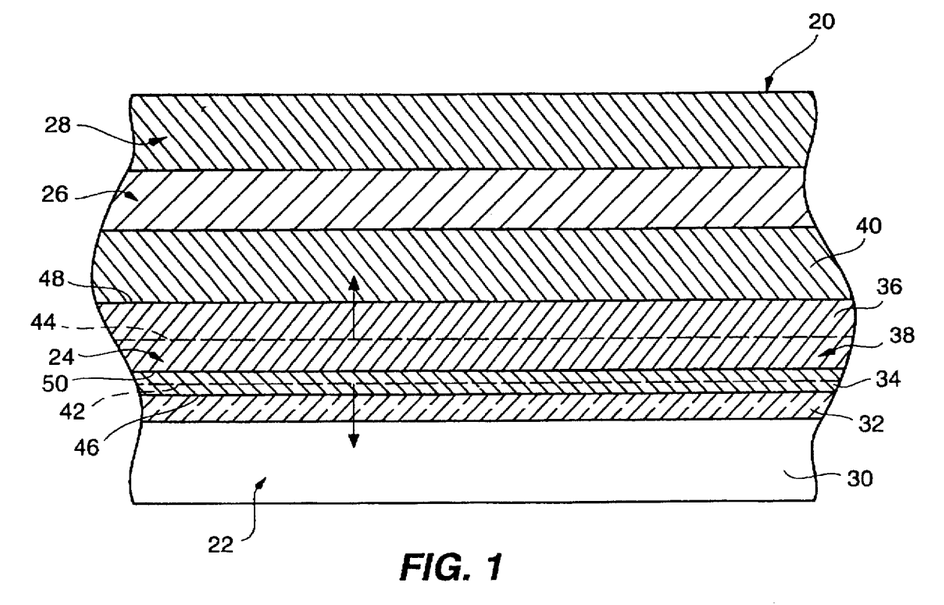
FIG. 1 depicts a thin-film capacitor device including a bottom electrode having a noble metal conductive layer portion and an adhesion metal layer portion that have commingled or interdiffuse to form a diffusion barrier region.

FIG. 1 depicts capacitor 20 including substrate 22, bottom electrode 24, metal oxide layer 26, and top electrode 28. Substrate 22 preferably includes conventional silicon layer 30, which is capped by isolation layer 32. Silicon layer 30 may be a single crystal or polycrystalline silicon, and is commercially available from a variety of sources as a silicon wafer. Layer 30 may also be formed of other known substrate materials, such as gallium arsenide, indium antimonide, magnesium oxide, strontium titanate, sapphire, quartz and combinations of the forgoing as well as other materials. Isolation layer 32 is preferably made of thick silicon dioxide, which is formed on layer 32 by well-known processes, e.g., SOG deposition or baking of layer 30 under oxygen in a diffusion furnace. As used herein, the term "substrate" specifically means a layer that provides support for any other layer. Substrate 22 serves to support all other layers, but the term substrate can also mean substrate 22 in combination with other layers. Accordingly, the combination of substrate 22 and bottom electrode 24 provides a substrate or support for metal oxide layer 26, which, in turn, provides support for top electrode 28.

Bottom electrode 24 includes a plurality of respective layers including adhesion metal portion 34, first noble metal portion 36, diffusion barrier region 38, and second noble metal layer 40.

Adhesion metal portion 34 is preferably made of titanium or tantalum sputtered to a thickness that preferably ranges from about 50 Å to 250 Å, and is most preferably 100 Å. First noble metal portion 36 is preferably platinum, but may also be other noble metals such as gold, silver, palladium, iridium, rhenium, ruthenium, and osmium, as well as conductive oxides of these metals. First noble metal portion 36 is preferably deposited by sputtering platinum atop adhesion metal portion 34 to a thickness ranging from three to fifteen times the thickness of adhesion metal portion 34, with the most preferred thickness being about 1000 Å when adhesion metal portion is 100 Å. Thicknesses outside the preferred range of values are still useful, but a thinner first noble metal portion 36 increasingly permits diffusion of adhesion metal moieties to layers above portion 36. A thicker portion 36 is increasingly wasteful of the noble metal material.

After deposition, portions 34 and 36 are preferably annealed to promote their interdiffusion, thereby providing barrier region 38. Region 38 is defined as the material between lower dashed line 42 and upper dashed line 44. Line 42 may be positioned anywhere within adhesion metal layer 34 including a position at interface 46 between oxide layer 32 and adhesion metal portion 34. Similarly, line 44 may be positioned up to interface 48 between first noble metal portion and second noble metal layer 40, within layer 40, or within layer 26. Interface 50 is positioned between adhesion metal portion 34 and first noble metal portion 36, and represents an interlayer boundary at a time prior to the diffusion that forms barrier region 38. Interface 50 is not necessarily observed in the final structure of bottom electrode 20, but the interface may be discernable even after some diffusible moieties have crossed between portions 34 and 36. In most circumstances, barrier region 38 extends fully through first noble metal portion 36 to interface 48, but only partially, if at all, into adhesion metal layer 34. Diffusion occurs by Fick's Law, but is also influenced by gravitational forces as a function of density differences between the respective metals.

Figure 2:
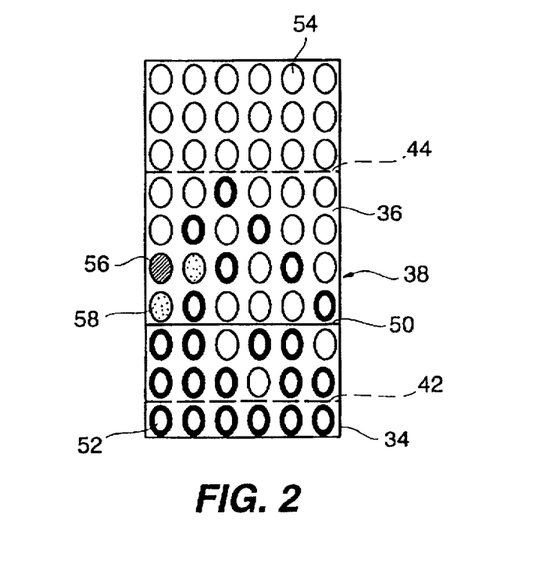
FIG. 2 schematically depicts the barrier layer region of FIG. 1 in more detail.

FIG. 2 depicts barrier region 38 in more detail. The dark circles, e.g., circle 52, represent adhesion metal atoms of adhesion metal portion 34. The white circles, e.g., circle 54, are noble metal atoms of first noble metal portion 36. Substantially no diffusion of noble metal atoms has occurred into layer 34 below line 42. Substantially no diffusion of adhesion metal atoms has occurred into layer 36 above line 44. Region 38 includes a mixture of adhesion metal atoms and noble metal atoms. The interdiffusion of portions 34 and 36 serves to increase the stability of the lattice, which correspondingly enhances resistance against diffusion through or from region 38. It should be understood that region 32, as depicted, contains a non-homogenous distribution of adhesion metal atoms and noble metal atoms. Longer annealing times and higher annealing temperatures will serve to increase the homogeneity of the atomic distribution within region 38, and this distribution can be substantially homogenous throughout both portions 34 and 36. Other diffused moieties may be present, such as the silicon dioxide from layer 32 that is represented by silicon atom 56 (dashed lines) and oxygen atoms 58 (dots).

Moderate-to-low dielectric silicon or silicon dioxide of the type exhibited as atoms 56 and 56 may sometimes migrate through the respective metalization layers (portions 34 and 36) as a bloom or slug of material. If these blooms succeed in migrating through to a high dielectric material, e.g., layer 26, the lower dielectric silicon dioxide can significantly impair the high-dielectric performance. The lattice that is depicted in region 38 is schematic in nature. The precise lattice structure of region 38 may vary, and it may be different from the diagram as shown.

Second noble metal layer 40 is preferably made out of the same noble metal as first noble metal portion 36. This noble metal is most preferably platinum having a thickness of about 1000 Å, i.e., a preferred thickness equal to the thickness of noble metal portion 36. Upon annealing of layer 40, it is possible for the upper boundary of barrier region 38 to move upward into layer 40 and across interface 48; however, in this circumstance, the concentration of diffusible moieties within layer 40 is greatly reduced or even negligible with respect to the concentration in portion 36. The formation of second noble metal layer 40 completes the structure of bottom electrode 24.

Adhesion metal portion 34 and noble metal portion 36 are annealed to form barrier region 38 prior to the deposition of second noble metal layer 40. An explanation of the general theoretical principles involved will facilitate an understanding of the invention.

A coefficient of diffusion is defined phenomenologically by Fick's Law $$J=-D\ (dn/dx),$$

wherein J is the molecular flux along a concentration gradient (dn/dx), and D is the diffusion coefficient. Diffusion through solids is normally a very slow process; however, in thin-film materials, the intralayer atom migration distances are also very small. During the annealing process, flux is accelerated as the elevated temperature promotes a corresponding increase in random atomic motions. These motions promote diffusion as flux in a net direction from a high concentration towards a low concentration of a given element.

Once the interdiffuse moieties of portions 34 and 36 have cooled, the resultant lattice has an increased thermodynamic stability because the intermixed noble metal and adhesion metal atoms bond together with increased force as compared to the respective pure metal layers. The increased force presents an energy barrier to atomic or molecular diffusion through the stabilized lattice. In this manner, post-anneal diffusion is significantly retarded or altogether eliminated. Therefore, second noble metal layer 40 has a significantly reduced flux of diffusible moieties, as compared to that of barrier region 38, because layer 40 is formed in an essentially pure condition or one having a much lower concentration of diffusible moieties. Actual results are also influenced by gravitational forces and the orientation of the substrate during the anneal. The substrate is preferably annealed in a level orientation.

If second noble metal layer 40 is merely deposited atop first noble metal portion 36 without first annealing portions 34 and 36, then no region 38 lattice exists to retard the diffusion of adhesion metal atoms throughout layer 40. The adhesion metal atoms then exist at higher concentrations immediately adjacent to metal oxide layer 26, and diffuse into metal oxide layer 26 as contaminants at correspondingly higher rates. These higher rates are most significant during the annealing process steps.

Metal oxide layer 26 is a dielectric or ferroelectric material that preferably has a perovskite or a perovskite-like layered superlattice structure. The preferred dielectric materials include liquid-deposited $ABO_3$ perovskites. Particularly preferred perovskites include BST. The most preferred BST has an average empirical formula of $Ba_{0.7}Sr_{0.3}TiO_3$, which is non-ferroelectric and functions as a thin-film high dielectric material. In BST, barium and strontium are the A-site elements, and titanium is the B-site element. The preferred ferroelectric materials include perovskite-like layered superlattice materials. Particularly preferred layered superlattice materials include strontium bismuth tantalate. The most preferred strontium bismuth tantalate has an average empirical formula of $SrBi_2Ta_2O_9$.

The $ABO_3$ structure may be composed of respective A and B elements having different valences. These A and B site elements are coupled as a ternary oxide. Known A-B ternary oxides include $A^{+1}B^{+5}$ materials (e.g., potassium niobate), $A^{+2}B^{+4}$ materials (e.g., strontium titanate or barium titanate), $A^{+3}B^{+3}$ materials (e.g., gadolinium iron oxide), complex oxides of the type $A^{+2}(B^{+3}_{0.7}B^{+6}_{0.3})$ [e.g., $Sr(Cr_{0.67}Re_{0.33})$], complex oxides of the type $A^{+2}(B^{+3}_{0.5}B^{+}_{0.5})$, and numerous other complex oxides.

Many high-dielectric perovskites are ferroelectrics, and many perovskite-like layered superlattice ferroelectrics are also high dielectrics. Non-ferroelectric dielectrics are preferred for use in dielectric applications because the ferroelectric polarization switching phenomenon also stores and releases current, which can sometimes produce surges that may interfere with the operation of other portions of integrated circuits, e.g., control logic circuits.

The presently claimed invention provides significant polarization improvements for ferroelectric materials and, particularly, for layered superlattice ferroelectrics. Layered superlattice materials at least include all three of the Smolenskii-type ferroelectric layered superlattice materials, namely, those having the respective average empirical formulae:

$$A_{m-1}S_2B_mO_{3m+3}; \tag{1}$$

$$A_{m+1}B_mO_{3m+1}; \text{ and} \tag{2}$$

$$A_mB_mO_{3m+2}, \tag{3}$$

wherein A is an A-site metal in the perovskite-like superlattice, B is a B-site metal in the perovskite-like superlattice, S is a trivalent superlattice-generator metal such as bismuth or thallium, and m is a number sufficient to balance the overall formula charge. Where m is a fractional number in the overall formula, the formula typically provides for a plurality of different or mixed perovskite-like layers each having a different integer value. The A-site metals and B-site metals may include mixtures of cations having similar ionic radii.

In layered superlattice materials according to Formula (1), thermodynamics favor the formation of oxygen octahedra structures in layers having a thickness of m octahedra according to the formula $$(A_{m-1}B_mO_{3m+1})^{2-}, \tag{4}$$

wherein m is an integer greater than one and the other variables are defined above. These layers are separated by bismuth oxide layers having the formula $$(Bi_2O_2)^{2+}, \tag{5}$$

wherein Bi is S of Formula (1).

The superlattice-generator layers, S, include oxides of bismuth (III), and may also include other similarly sized trivalent metal cations such as thallium (III). Bismuth also functions as an A-site metal in the perovskite-like lattice if it is present in excess of the stoichiometrically required amount for generating the layered superlattice material according to Formula (I).

Top electrode 28 is preferably a noble metal that is sputtered over metal oxide layer 26. The thickness of top electrode 28 preferably ranges from about 1000 Å, to about 2000 Å, but the thickness can be a value outside of this range. Electrode 28 is most preferably made of platinum.

Figure 3:
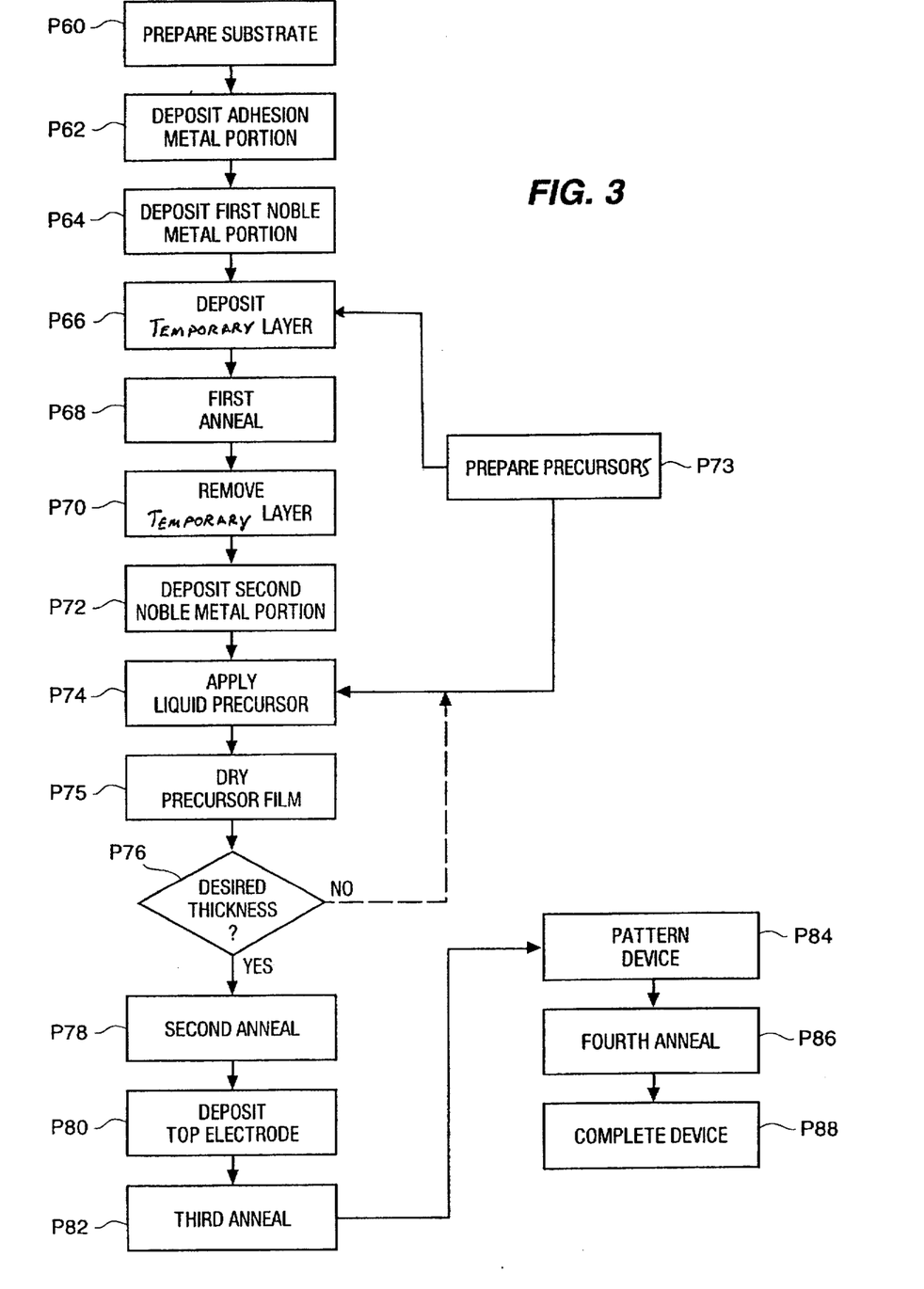
FIG. 3 depicts a flow chart process diagram for use in making the capacitor of FIG. 1.

FIG. 3 depicts a flow chart of a process for making capacitor 20. The process shall be discussed in terms of the embodiment of FIG. 1, but those skilled in the art will understand its applicability to other embodiments.

In step P60, a silicon wafer is prepared as substrate 22 having silicon layer 30 and silicon dioxide layer 32. Silicon layer 30 can be baked under oxygen in a diffusion furnace at a temperature ranging from about 500° C. to about 1100° C. to eliminate surface impurities and water, and form oxide coating 32. Generally, depending upon the nature of the device sought to be constructed, step P60 may also include conventional procedures such as the etching of contact holes (not depicted) and the doping of layer 30 (generally, substrate 22) for transistor or memory circuits.

Step P62 includes sputtering titanium adhesion metal portion 34 atop oxide layer 32 to a preferred thickness ranging from about 50 Å, to 250 Å according to conventional protocols as are known in the art. Step P64 includes sputtering a platinum first noble metal portion 38 to a preferred thickness ranging from about 1000 Å to 2000 Å atop portion 34. Examples of preferred atomic sputtering protocols include radio frequency sputtering and DC magnetron sputtering.

Step P66 includes depositing a metal oxide precursor or SOG precursor atop noble metal portion 36. This precursor is preferably a liquid precursor, but may also be sputtered from a solid target. Commercially available SOG precursor solutions are preferred precursors. The most preferred precursor is the same precursor that will be applied in step P73 and, especially, a strontium bismuth tantalate layered superlattice material. The SOG precursor is preferably deposited to a thickness of about 1000 Å while spinning the substrate at about 3000 rpm. Where the precursor of step P73 is applied, the substrate will preferably be spun at about 1500 rpm to obtain a thickness of about 750 Å. The liquid precursor is optionally dried at a temperature ranging from about 200° C. to 500° C. for a period of time ranging from about five minutes to about thirty minutes.

Step P68 is referred to as the "first anneal" to distinguish it from other anneal steps; however, it should be understood that other anneal steps can occur prior to this "first anneal." For example, steps P60 and P62 each may include numerous annealing steps. In step P68, the substrate including portions 34 and 36 is preferably heated in a diffusion furnace under an oxygen atmosphere to a temperature ranging from 450° C. to 1000° C. for a time ranging from 30 minutes to 2 hours. Step P68 is more preferably conducted at a temperature ranging from 600° C. to 800° C., with the most preferred anneal temperature being about 600° C. for eighty minutes. The first anneal of step P68 preferably occurs in a push/pull process including five minutes for the "push" into the furnace and five minutes for the "pull" out of the furnace. The indicated anneal times include the time that is used to create thermal ramps into and out of the furnace.

In a commercial manufacturing process, it will be advantageous to provide careful control of all annealing temperatures and times for purposes of providing consistent and reproducible results. Cooling of the substrate to room temperature yields barrier region 38 as generally depicted in FIGS. 1 and 2.

Figure 4:
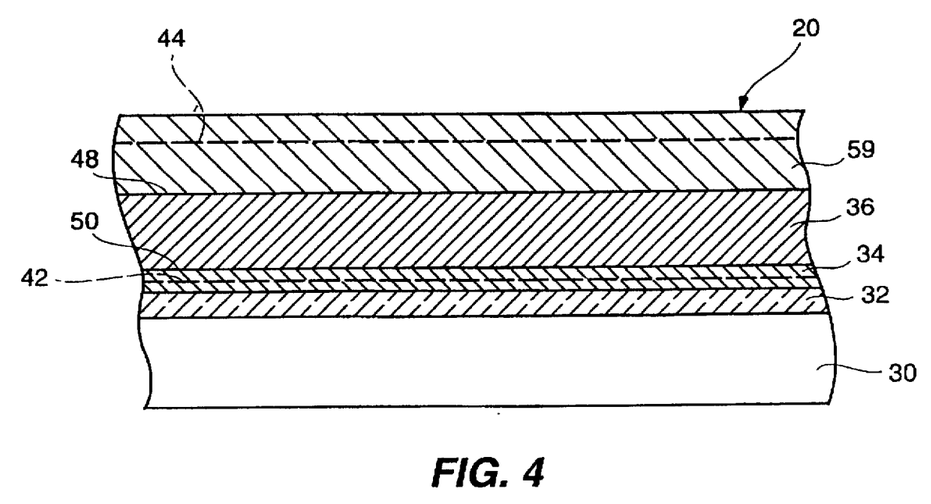
FIG. 4 depicts the capacitor of FIG. 1 at an intermediate stage of construction including a temporary capping layer.

FIG. 4 depicts the structure of capacitor 20 through step P68. The device is capped by metal oxide or SOG layer 59. As depicted in FIG. 4, diffusion region boundary 44 (indicating titanium contamination) has crossed interface 48 into layer 59. The remaining layers of FIG. 4 are, otherwise, as described in FIG. 1.

Step P70 includes removal of layer 59 by etching. A liquid etching technique is preferably employed. When layer 59 is SOG, it is preferably removed using a buffered oxide etchant, such as the 10:1 BOE solution that is available for this purpose from General Chemical of Parisippane, N.J. These solutions typically include a mixture of water and hydrofluoric acid with an ammonium fluoride buffer. The etch rate typically ranges from about 20 Å to 25 Å per second. Use of BOE etchant is not appropriate for layered superlattice materials, such as strontium bismuth tantalate.

When layer 59 is strontium bismuth tantalate, the etchant preferably includes a mixture of $HNO_3$, $H_2O$, and HF. These ingredients are mixed in the following volumetric proportions: 200 parts of 60% to 70% $HNO_3$ (weight percent mixed with water); 80 parts distilled $H_2O$; and 3 parts of 46% to 49% HF (weight percent mixed with water). The etch rate typically ranges from 240 Å to 300 Å per minute at 20° C., but process conditions may vary to provide a rate that ranges from 50 Å to 500 Å per minute.

The etchant is quenched by rinsing in a distilled water dump-rinser bath, and the wafer is preferably spun dry at about 1500 rpm.

Figure 5:
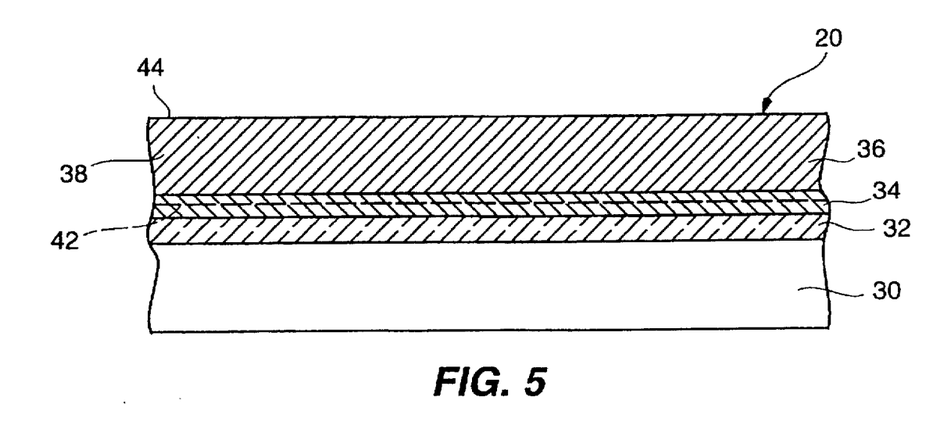
FIG. 5 depicts the capacitor of FIG. 5 after removal of the temporary capping layer.

Step P72 includes the deposition of platinum second noble metal layer 40 to a preferred thickness ranging from about 1000 Å to 2000 Å over the annealed barrier region 38. This deposition preferably occurs by sputtering. Step P72 completes bottom electrode 24 (FIG. 1). FIG. 5 depicts the structure of FIG. 4 having layer 59 removed by etching.

Step P73 includes the preparation of a liquid precursor solution having a plurality of metal moieties in effective amounts for yielding metal oxide layer 26 upon drying and annealing of the precursor solution. Additional details pertaining to the preparation of this precursor solution will be provided below.

In step P74, the precursor solution from step P73 is applied to the substrate from step P72, which presents the uppermost surface of bottom electrode 24 to receive the liquid precursor. This application is preferably conducted by dropping the liquid precursor solution at ambient temperature and pressure onto the uppermost surface of bottom electrode 24 then spinning the substrate at from about 1500 RPM to 2000 RPM for about 30 seconds to remove any excess solution and leave a thin-film liquid residue. The most preferred spin velocity is 1500 RPM. Alternatively, the liquid precursor may be applied by a misted deposition technique, such as the technique described in copending application Ser. No. 07/993,380, which is hereby incorporated by reference herein to the same extent as though fully disclosed herein. Preferred precursor solutions include those having metal moieties in effective amounts for yielding a layered superlattice material. The most preferred layered superlattice material is strontium bismuth tantalate.

In step P75, the liquid precursor film from step P74 is preferably dried on a hot plate in a dry air atmosphere and at a temperature of from about 200° C. to 500° C. The drying time and temperature should be sufficient to remove substantially all of the organic materials from the liquid thin film and leave a dried metal oxide residue. The drying time preferably ranges from about one minute to about thirty minutes. For single-stage drying, a 400° C. drying temperature over a duration of about two to ten minutes in air is most preferred. It is more preferred, however, to dry the liquid film in stepped intervals. For example, the film can be dried for five minutes at 260° C. and for five minutes at 400° C. Additionally, it is preferred to conclude the drying cycle with a brief heating interval at a temperature exceeding 700° C., e.g., using a tungsten-nickel lamp to heat the substrate to 725° C. for thirty seconds. The drying step P75 is essential in obtaining predictable or repeatable electronic properties in the final metal oxide crystal compositions.

In step P76, if the resultant dried film from step P75 is not of the desired thickness, then steps P72, P74, and P75 are repeated until the desired thickness is attained. A thickness of about 1800 Å to 2000 Å typically requires two coats of a 0.130M to 0.200M precursor solution under the parameters disclosed herein.

In step P78, the dried precursor residue from steps P75 and P76 is annealed to form the metal oxide of layer 26. This annealing step is referred to as the second anneal to distinguish it from a other annealing steps. This second anneal is preferably conducted under conditions that are identical to the conditions of the first anneal in step P68.

In step P80, top electrode 28 is preferably deposited by sputtering platinum atop metal oxide layer 26. The third anneal of step P82 is optional, and preferably occurs under conditions identical to the first anneal of step P68.

The device is then patterned by a conventional photoetching process, e.g., including the application of a photoresist followed by ion etching lithography in step P84. This patterning preferably occurs before the fourth annealing of step P86 so that the fourth anneal will serve to remove patterning stresses from capacitor 20 and correct any defects that are created by the patterning procedure.

The fourth annealing step, P86, is preferably conducted in like manner with the first anneal in step P68.

Finally, in step P88 the device is completed and evaluated. The completion may entail the deposition of additional layers, ion etching of contact holes, and other procedures, as will be understood by those skilled in the art. Substrate or wafer 22 may be sawed into separate units to separate a plurality of integrated circuit devices that have been simultaneously produced thereon.

A preferred general process for preparing the polyoxyalkylated metal precursors of step P73 is provided in application Ser. No. 08/132,744 filed Oct. 6, 1993, which is hereby incorporated by reference herein to the same extent as though fully disclosed herein, and application Ser. No. 07/965,190, which is hereby incorporated by reference herein to the same extent as though fully disclosed herein. The processes preferably include reacting a metal with an alkoxide (e.g., 2-methoxyethanol) to form a metal alkoxide, and reacting the metal alkoxide with a carboxylate (e.g., 2-ethylhexanoate) to form a metal alkoxycarboxylate according to one of the generalized formulae:

(6)

(7)

wherein M is a metal cation having an outer valence of (a+n) and M' is a metal cation having an outer valence of b, with M and M' preferably being independently selected from the group consisting of tantalum, calcium, bismuth, lead, yttrium, scandium, lanthanum, antimony, chromium, thallium, hafnium, tungsten, niobium, vanadium, zirconium, manganese, iron, cobalt, nickel, magnesium, molybdenum, strontium, barium, titanium, and zinc; R and R' are respective alkyl groups preferably having from 4 to 9 carbon atoms and R" is an alkyl group preferably having from 3 to 8 carbon atoms. The latter formula, which has a central —O—M—O—M'—O— structure, is particularly preferred due to the formation in solution of at least 50% of the metal to oxygen bonds that will exist in the final solid metal oxide product.

The liquid precursor is preferably a metal alkoxide or metal carboxylate, and is most preferably a metal alkoxycarboxylate diluted with a xylene or octane solvent to a desired concentration. The use of an essentially anhydrous metal alkoxycarboxylate is particularly preferred due to the corresponding avoidance of water-induced polymerization or gelling, which can significantly reduce the shelf-life of solutions that contain alkoxide ligands. The presence of any hydrolysis-inducing moiety in solution is preferably avoided or minimized. Hydrolyzed precursors, such as conventional sol-gels, may also be utilized, but the increased solution viscosity tends to impair the uniformity of thickness derived from the preferred spin-on application process, and the quality of the hydrolyzed solution tends to degrade rapidly with time. As a consequence, made-ready hydrolyzed gels increasingly yield poor quality metal oxide films of inconsistent quality over a period of time. The preferred method permits the preparation of precursor solutions well in advance of the time that they are needed.

The precursor solutions may be designed to yield corresponding layered superlattice materials or perovskites, with the understanding that the formation of oxygen octahedra structures is thermodynamically favored where possible. Generally, in terms of either the perovskite-like octahedral structure or the perovskite octahedral structure, equivalent substitutions may be made between metal cations having substantially similar ionic radii, i.e. radii that vary no more than about 20% at the respective lattice sites. These substitutions are made by adding the alternative metal moieties to the precursor solution.

The preferred ingredients of the precursor solutions include the preferred metals of the desired perovskite or layered superlattice material in a stoichiometrically balanced combination according to the empirical formula. The A-site portion is preferably formed by reacting with an alcohol or carboxylic acid at least one A-site element selected from an A-site group consisting of Ba, Bi, Sr, Pb, La, Ca, and mixtures thereof. The B-site portion is preferably derived by reacting an alcohol or carboxylic acid with at least one B-site element selected from a B-site group consisting of Zr, Ta, Mo, W, V, Nb, and mixtures thereof. The use of titanium as an equivalent radius B-site element, though possible, is less preferred in practice due to problems that derive from titanium diffusion into other integrated circuit components and point charge defects that arise from different valence states among the titanium ions. Even so, the exceptional dielectric performance and longevity of BST materials makes it worthwhile to accommodate the possibility of titanium diffusion. In the case of layered superlattice materials, there is also added a trivalent superlattice-generator metal, which is preferably bismuth. With heating, the bismuth content will spontaneously generate bismuth oxide layers in the layered superlattice materials, but an excess bismuth portion can also provide A-site elements for the perovskite-like lattice.

Figure 6:
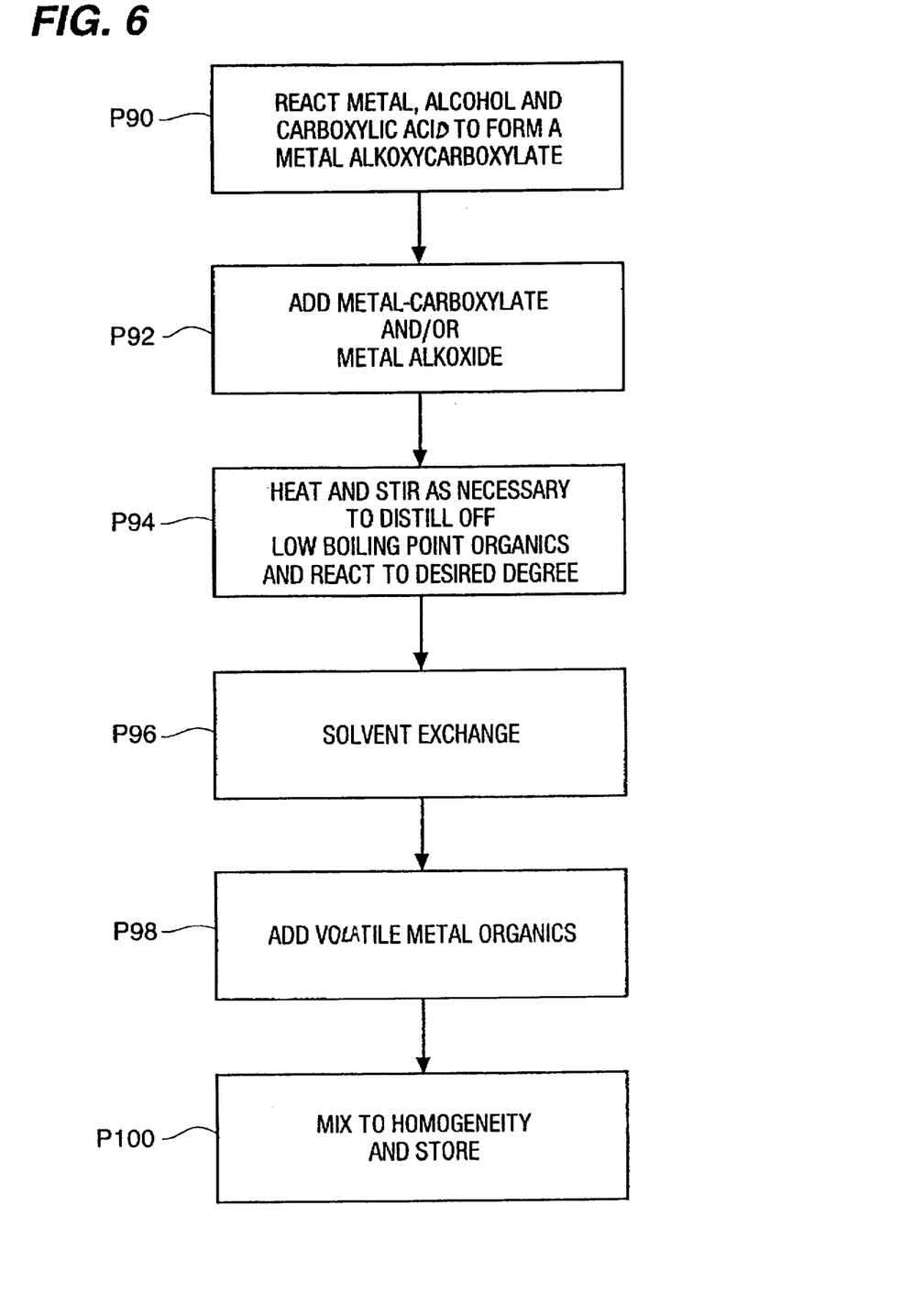
FIG. 6 depicts a flow chart process diagram for use in making a liquid precursor solution that may be used in the FIG. 3 process.

FIG. 6 depicts a flow chart of a generalized process according to the present invention for providing a liquid precursor solution to be used in step P72. The word "precursor" is often used ambiguously in this art. It may mean a solution containing one metal that is to be mixed with other materials to form a final solution, or it may mean a solution containing several metals made-ready for application to a substrate. In this discussion we shall refer to the made-ready type of precursor as a "precursor," unless a different meaning is clear from the context. In intermediate stages the solution may be referred to as the "pre-precursor."

The preferred generalized reaction chemistry for the formation of liquid solutions of metal alkoxides, metal carboxylates, and metal alkoxycarboxylates for use in producing the initial metal precursor portions is as follows:

alkoxides—$M^{+n}$+n R—OH → $M(—O—R)_n$+n/2 $H_2$     (8)

carboxylates—$M^{+n}$+n (R—COOH) → $M(—OOC—R)_n$+n/2 $H_2$ (9)

alkoxycarboxylates—$M(—O—R')_n$+b R—COOH+heat →
    $(R'—O—)_{n-b}M(—OOC—R)_b$+b HOR,     (10)

where M is a metal cation having a charge of n; b is a number of moles of carboxylic acid ranging from 0 to n; R' is preferably an alkyl group having from 4 to 15 carbon atoms and R is preferably an alkyl group having from 3 to 9 carbon atoms.

In step P90 a first metal, indicated by the term M in the equations above, is reacted with an alcohol and a carboxylic acid to form a metal-alkoxycarboxylate pre-precursor. The process preferably includes reacting a metal with an alcohol (e.g., 2-methoxyethanol) to form a metal alkoxide according to Equation (8), and reacting the metal alkoxide with a carboxylic acid (e.g., 2-ethylhexanoic acid) to form a metal alkoxycarboxylate according to Equation (10). A reaction according to Equation (9) is also observed in the preferred mode when the unreacted metal is simultaneously combined with the alcohol and the carboxylic acid. The simultaneous reactions are preferably conducted in a reflux condenser that is heated by a hot plate having a temperature ranging from about 120° C. to about 200° C. over a period of time ranging from one to two days to permit substitution of the alkoxide moieties by carboxylate ligands. At the end of the initial one to two day reaction period, the reflux condenser is preferably opened to atmosphere, and the solution temperature is monitored to observe a fractional distillation plateau that indicates the substantial elimination of all water and alcohol portions from the solution, i.e., a plateau exceeding at least about 100° C., at which time the solution is removed from the heat source. Distillation to atmospheric pressure is more preferably is conducted to a temperature of at least 115° C., and most preferably to a temperature of about 123° C. to 127° C.

In the above equations, the metal is preferably selected from the group consisting of tantalum, calcium, bismuth, lead, yttrium, scandium, lanthanum, antimony, chromium, thallium, hafnium, tungsten, vanadium, niobium, zirconium, manganese, iron, cobalt, nickel, magnesium, molybdenum, strontium, barium, titanium, vanadium, and zinc. Alcohols that may be used preferably include 2-methoxyethanol, 1-butanol, 1-pentanol, 2-pentanol, 1-hexanol, 2-hexanol, 3-hexanol, 2-ethyl-1-butanol, 2-ethoxyethanol, and 2-methyl-1-pentanol, preferably 2-methoxyethanol. Carboxylic acids that may be used preferably include 2-ethylhexanoic acid, octanoic acid, and neodecanoic acid, preferably 2-ethylhexanoic acid.

The reactions of step P90 and subsequent steps are preferably facilitated by the use of a compatible solvent. Solvents that may be used include xylenes, 2-methoxyethanol, n-butyl acetate, n-dimethylformamide, 2-methoxyethyl acetate, methyl isobutyl ketone, methyl isoamyl ketone, isoamyl alcohol, cyclohexanone, 2-ethoxyethanol, 2-methoxyethyl ether, methyl butyl ketone, hexyl alcohol, 2-pentanol, ethyl butyrate, nitroethane, pyrimidine, 1, 3, 5 trioxane, isobutyl isobutyrate, isobutyl propionate, propyl propionate, ethyl lactate, n-butanol, n-pentanol, 3-pentanol, toluene, ethylbenzene, and octane, as well as many others. These solvents preferably have boiling points exceeding that of water for purposes of distilling the precursor to eliminate water therefrom prior to application of the precursor to a substrate. The cosolvents should be miscible with one another and may be compatibly mixed in differing proportions, especially between polar and apolar solvents, as needed to fully solubilize the precursor ingredients. Xylenes and octane are particularly preferred apolar solvents, and n-butyl acetate is a particularly preferred polar cosolvent.

Portions of step P90 can be skipped in the event that intermediate metal reagents can be obtained in research grade purity. For example, where tantalum isobutoxide is available, it will only be preferred to substitute the isobutoxide moiety with an acceptable carboxylate ligand by reacting the metal alkoxide with a carboxylic acid such as 2-ethylhexanoic acid according to Equation (10).

In a typical second step, P92, a metal-carboxylate, a metal-alkoxide or both may be added to the metal-alkoxycarboxylate in effective amounts to yield an intermediate precursor having a stoichiometrically balanced mixture of superlattice-forming metal moieties that is capable of yielding a solid metal oxide for layer 26. At this time the mixture will preferably exclude bismuth compounds which, if needed, will be added later due to their relative thermal instability. Any of the metals listed above may be reacted with any of the carboxylic acids listed above to form the metal carboxylate, while any of the metals listed above may be reacted with any of the alcohols may form the alkoxide. It is particularly preferred to conduct this reaction in the presence of a slight excess amount of carboxylic acid for purposes of partially substituting alkoxide ligands with carboxylate ligands.

In step P94 the mixture of metal-alkoxycarboxylates, metal-carboxylates and/or metal-alkoxides is heated and stirred as necessary to form metal-oxygen-metal bonds and boil off any low-boiling point organics that are produced by the reaction. According to a generalized reaction theory, if a metal-alkoxide is added to the metal-alkoxycarboxylate, and the solution is heated, the following reactions occur:

where M and M' are metals; R and R' are defined above; R" is an alkyl group preferably having from about zero to sixteen carbons; and a, b, and x are integers denoting relative quantities of corresponding substituents corresponding to the respective valence states of M and M'. Generally the reaction of Equation (11) will occur first since metal alkoxides react more readily than metal carboxylates. Thus, ethers having low boiling points are generally formed. These ethers boil out of the pre-precursor to leave a final product having a reduced organic content and the metal-oxygen-metal bonds of the final desired metal oxide already partially formed. If the heating is sufficient, some of the reaction (12) will also occur, creating metal-oxygen-metal bonds and esters. Esters generally have higher boiling points and remain in solution. These high boiling point organics slow down the drying process after the final precursor is applied to a substrate, which tends to reduce cracking and defects; thus, in either case, metal-oxygen-metal bonds are formed and the final precursor performance is improved.

Step P94 is in essence a distillation to eliminate volatile moieties from solution as the reactions of equations (11) and (12) proceed. The elimination of volatile moieties from solution drives the reactions to completion, i.e., a high rate of efficiency. The elimination of volatile moieties from solution also serves to prevent film cracking and other defects that, otherwise, can be associated with the presence of volatile moieties in solution. Accordingly, the progress of reactions (11) and (12) can be monitored by the rate of solution heating as well as the volume of fluid exiting the solution. It is preferred to heat the solution to a boiling point plateau of at least 115° C., more preferably to 120° C., and most preferably from 123° C. to 127° C.

If a metal-carboxylate is added to the metal-alkoxycarboxylate and the mixture is heated, the following reaction occurs:

where R—COOOC—R' is an acid anhydride, and the terms are as defined above. This reaction requires considerably more heat than do the reactions (11) and (12) above, and proceeds at a much slower rate.

In addition to the above reactions which produce metal-alkoxycarboxylates, reactions occur such as:

where the terms are as defined above. This reaction, with heating in the presence of excess carboxylic acid, substitutes the alkoxide part of the intermediate metal-alkoxycarboxylate to form a substantially full carboxylate; however, it is now believed that a complete substitution of the alkoxides by the carboxylates does not occur with the parameters as disclosed herein. Full substitution of the carboxylates requires significantly more heating, and even then may not readily occur.

At the end of step P94, it is preferable to have formed in solution at least 50% of the metal to oxygen bonds of the metal oxide layer 26. The reactions are preferably conducted in a vessel that is open to atmospheric pressure and is heated by a hot plate preferably having a temperature ranging from about 120° 0 to about 200° C. until the solution temperature is monitored to observe a fractional distillation plateau that indicates the substantial elimination of all water, alcohol, ether, and other reaction byproduct portions from the solution, i.e., a plateau at least exceeding 100° C. At this time, extended refluxing can produce a potentially undesirable amount of an ester or acid anhydride byproduct that is often difficult to remove from the solution by fractional distillation. The potential complication of an excessive acid anhydride concentration can be entirely avoided by adding only metal carboxylates in step P92 to eliminate a possible need for refluxing the solution.

Step P96 is an optional solvent exchange step. The use of a common solvent in a variety of precursor solutions is advantageous due to the predictability of fluid parameters such as viscosity and adhesion tension, which influence the thickness of the liquid precursor film after it is applied to a substrate. These fluid parameters also affect the quality and the electrical performance of the corresponding metal oxide film after annealing of the dried precursor residue. In step P96, the standard solvent, which is preferably xylenes or n-octane, is added in an amount that is appropriate to adjust the intermediate precursor to a desired molarity of superlattice ingredients. This molarity preferably ranges from about 0.100M to about 0.400M in terms of the empirical formula for the metal oxide material, and is most preferably about 0.130M to 0.200M in terms of moles of metal oxide material that may be formed from a liter of solution. After the addition of the standard solvent, the solution is heated to a temperature that is sufficient to distill away any non-standard solvents and leave a solution having the desired molarity.

Step P98 is preferably used only in the case of precursors for layered superlattice materials that include bismuth. Bismuth ($Bi^{3+}$) is the most preferred superlattice-generator element, and the bismuth preprecursor will most preferably be bismuth tri-2-ethylhexanoate. The addition of bismuth pre-precursors subsequent to the heating of step P94 is preferred due to the relative instability of these pre-precursors, i.e., substantial heating could disrupt coordinate bonds with potential deleterious effects upon the ability of the solution to yield superior thin-film metal oxides. It should be understood that step P98 is optional in the sense that bismuth pre-precursors can often be added in any of steps P90 and P94 without problems.

Special problems exist with regard to the potential for bismuth volatilization during heating of the precursor solution and, especially, during high temperature annealing of the dried precursor residue in forming a layered superlattice material of the desired stoichiometric proportions. Accordingly, in step P98, it is preferred to add from about 5% to about 15% excess bismuth for purposes of compensating the precursor solution for anticipated bismuth losses. At annealing temperatures ranging from about 600° C. to about 850° C. for a period of about one hour, this excess bismuth moiety in the precursor solution will typically range from 5% to 15% of the amount that is required for a stoichiometrically balanced layered superlattice product. In the event that the excess bismuth is not fully volatilized during the formation of a metal oxide product, the remaining excess bismuth moiety can act as an A-site material and, thus, induce point defects in the resulting layered superlattice crystal.

In step P100, the solution is mixed to substantial homogeneity, and is preferably stored under an inert atmosphere of desiccated nitrogen or argon if the final solution will not be consumed within several days or weeks. This precaution in storage serves to assure that the solution is kept essentially water-free and avoids the deleterious effects of water-induced polymerization, viscous gelling, and precipitation of metallic moieties that water can induce in alkoxide ligands. Even so, the desiccated inert storage precaution is not strictly necessary when the precursor, as is preferred, primarily consists of metals bonded to carboxylate ligands and alkoxycarboxylates.

The exemplary discussion of the reaction process, as given above, above is generalized and, therefore, non-limiting. The specific reactions that occur depend on the metals, alcohols, and carboxylic acids used, as well as the amount of heat that is applied. Detailed examples will be given below.

The following non-limiting examples set forth preferred materials and methods for practicing the present invention.

EXAMPLE 1

Preparation of a BST Precursor Solution

A detailed example of the process of preparing the precursors used to deposit BST is given below. Referring to FIG. 6, in step P90, the compounds shown in Table I were measured.

TABLE 1

Major Reagents For A Precursor Capable of Producing Barium Strontium Titanate (BST) - $Ba_{0.7}Sr_{0.3}TiO_3$

| Compound | FW | g | mmole | Equiv. |
|---|---|---|---|---|
| Barium | 137.33 | 9.4255 | 68.635 | 0.69986 |
| 2-ethylhexanoic acid | 144.21 | 19.831 | 137.51 | 1.4022 |
| Strontium | 87.62 | 2.5790 | 29.434 | 0.30014 |
| 2-ethylhexanoic acid | 144.21 | 8.5005 | 88.945 | 0.6010 |
| Titanium Isopropoxide | 284.26 | 27.878 | 98.072 | 1.0000 |

In Table 1, "FW" indicates formula weight, "g" indicates grams, "mmoles" indicates millimoles, and "Equiv." indicates the equivalent number of moles in solution.

The barium was placed in 100 ml (milliliters) of 2-methoxyethanol. The 2-ethylhexanoic acid was added and the mixture was allowed to react while stirring. This step may also be performed by placing the barium in the 2-methoxyethanol, allowing it to react, adding the 2-ethylhexanoic acid, and stirring while the mixture reacts. Hydrogen gas was a by-product of the reaction and escaped from the solution. The exothermic reaction of the barium heated the solution. While the solution was still hot, the strontium was added and allowed to react. The heat in solution from the barium reaction assisted the strontium reaction. When the strontium was all reacted, the second measure of 2-ethylhexanoic acid was added, and the solution was stirred while heating for several hours at a maximum temperature of 115° C. This ensured that any water present was distilled out.

The mixture was then allowed to cool, and in step P92 the titanium isopropoxide was added followed by the addition of enough 2-methoxyethanol to make 220 ml of total solution. The solution was then heated and stirred. Ethers and some esters could be smelled during this reaction. The ethers were low boiling point liquids and generally boiled out of solution while the esters were higher boiling point liquids, which tended to remain in solution. During the heating, the maximum temperature was 116° C., which also ensured that substantially all isopropanol and water were distilled out. The resultant solution was diluted to 200 ml total solution with additional 2-methoxyethanol. The result was a final BST precursor having a 0.490 molar concentration with the ratio of barium to strontium equalling 0.69986: 0.30014. The solution was then ready for use in a BST coating process for thin-film capacitor formation, per step P73 of FIG. 3.

EXAMPLE 2

Preparation of a Layered Superlattice Precursor Solution

The precursor ingredients of Table 1 were obtained from the indicated commercial sources and subdivided to obtain the portions shown.

TABLE 1

| Ingredient | Formula Weight (g/mol) | Grams | mmole | Molar Equiv. | Vendor |
|---|---|---|---|---|---|
| tantalum pentabutoxide $Ta(OC_4H_9)_5$ | 546.52 | 43.722 | 80.001 | 2.0000 | Vnipim |
| 2-ethylhexanoic acid | 144.21 | 72.684 | 504.01 | 12.600 | Aldrich |
| strontium | 87.62 | 3.5048 | 40.000 | 1.0000 | Strem |
| bismuth tri-2-ethyl-hexanoate (in naptha) $Bi(O_2C_6H_{11})_3$ | (765.50) | 66.752 | 87.201 | 2.1800 | Strem |

The tantalum pentabutoxide and 252.85 mmol portion of 2-ethylhexanoic acid were placed in a 250 ml Edenmeyer flask with 40 ml of xylenes, i.e., about 50 ml xylenes for each 100 mmol of tantalum. The flask was covered with a 50 ml beaker to assist in refluxing and to isolate the contents from atmospheric water. The mixture was refluxed with magnetic stirring on a 160° C. hot plate for 48 hours to form a substantially homogenous solution including butanol and tantalum 2-ethylhexanoate. It should be understood that the butoxide moiety in solution was almost completely substituted by the 2-ethylhexanoic acid, but full substitution did not occur within the heating parameters of this example. At the expiration of 48 hours, the 50 ml beaker was removed and the hot plate temperature was then raised to 200° C. for distillation of the butanol fraction and water to eliminate the same from solution. The flask was removed from the hot plate when the solution first reached a temperature of 124° C., as a temperature indicator that substantially all butanol and water had exited the solution. The flask and its contents were cooled to room temperature.

The strontium and 50 ml of 2-methoxyethanol solvent were added to the cooled mixture for reaction to form strontium di-2-ethylhexanoate. A 100 ml portion of xylenes was added to the strontium mixture, and the flask and its contents were returned to the hot plate at 200° C. and refluxed for five hours with the 50 ml beaker again in place for reaction to form a predominant tantalum-strontium alkoxycarboxylate product according to Formula (6). The beaker was removed and the solution temperature was allowed to rise to 125° C. for elimination of the 2-methoxyethanol solvent from solution, as well as any ethers, alcohols, or water in solution. After removal from the heat source, the flask was permitted to cool to room temperature. The bismuth tri-2-ethylhexanoate was added to the cooled solution, which was further diluted to 200 ml with xylenes to form a precursor solution that was capable of forming 0.200 moles of $SrBi_{2.18}Ta_2O_{9.27}$ in the absence of bismuth volatilization.

Accordingly, this example indicates that step P90, i.e., the reaction of strontium metal, an alcohol, and a carboxylic acid, can occur in solution with the tantalum alkoxycarboxylate derived from tantalum pentabutoxide and 2-ethylhexanoic acid. Therefore, steps P90 and P92 can be conducted in a single solution, and in reverse of the FIG. 6 sequence.

The precursor formulation was designed to compensate for bismuth volatilization during a process of manufacturing solid metal oxides from the liquid precursor. Specifically, the $Bi_{2.18}$ moiety included an approximate nine percent excess (0.18) bismuth portion. After accounting for the anticipated bismuth volatilization during the forthcoming annealing steps, the precursor solution would be expected to yield a stoichiometric m=2 material according to Formula (3), i.e., 0.2 moles of $SrBi_2Ta_2O_9$ per liter of solution.

EXAMPLE 3

Formation of Ferroelectric Capacitors Using a Temporary Capping Layer and Coating an Annealed Bottom Electrode with Additional Platinum Metal A ferroelectric capacitor of the type depicted in FIG. 1 was produced according to the general method of FIG. 3. A conventional four inch diameter polycrystalline wafer or substrate 30 was prepared to receive the $SrBi_2Ta_2O_9$ solution of Example 2. The preparation process included diffusion furnace baking at 1100° C. in oxygen according to conventional protocols for yielding a thick layer of silicon oxide 32 (see FIG. 1).

The substrate including oxide 32 was cooled to room temperature, and inserted into a vacuum chamber for conventional DC magnetron sputtering. A discharge voltage of 95 volts and a current of 0.53 amperes was utilized at a sputter pressure of 0.0081 Torr to sputter a 100 Å thickness of titanium metal as adhesion metal portion 34 on oxide layer 32. A discharge voltage of 130 volts and a current of 0.53 amperes was then used to sputter a 1000 Å thickness of platinum atop the titanium metal.

A 2 ml volume of a 0.2M $SrBi_2Ta_2O_9$ precursor prepared according to Example 2 was adjusted to a 0.13M concentration by the addition of 1.08 ml n-butyl acetate and passed through a 0.2 µm filter. An eyedropper was used to apply 2 ml of precursor solution to the substrate, which was then spun at 1500 rpm in a conventional spin-coater machine. These actions completed the process of FIG. 3 through step P66. The liquid precursor film was not dried prior to the first anneal of step P68.

The substrate including the liquid thin film was annealed for thirty minutes at a temperature of 600° C. in a diffusion furnace under an oxygen atmosphere. This time included a five minute push into the furnace and a five minute pull out of the furnace. The resultant structure included layer 59 as depicted in FIG. 4. These actions completed step P68

Layer 59 was removed in step P70 by contacting layer 59 with a liquid etching solution under an air atmosphere for two minutes at 20° C. The etching solution contained a mixture of 70% (w/w) $HNO_3$, $H_2O$, and 49% (w/w) HF in the volumetric proportions of 200:80:3, as described above. The etchant was quenched in a distilled water dump rinser, and the substrate was spun dry at 1500 rpm.

A 1000 Å thickness of platinum was sputtered as layer 40 (FIG. 1) under the same sputtering conditions as before.

A 2 ml volume of the 0.2M $SrBi_2Ta_2O_9$ precursor from Example 2 was adjusted to a 0.13M concentration by the addition of 1.08 ml n-butyl acetate and passed through a 0.2 µm filter. An eyedropper was used to apply 2 ml of precursor solution to the substrate, which was then spun at 1500 rpm in a conventional spin-coater machine as before. The precursor-coated substrate was removed from the spin-coating machine and dried in air for two minutes on a 140° C. hot plate. The substrate was dried for an additional four minutes on a second hot plate at 260° C. The substrate was dried for an additional thirty seconds in oxygen at 725° C. using a 1200 W tungsten-halogen lamp (visible spectrum; Heatpulse 410 by AG Associates, Inc., using J208V bulbs by Ushio of Japan). The spin-coating and drying procedure was repeated a second time to increase the overall thickness of layer 26 to about 1800 Å.

Substrate 22 including the two coats of dried precursor residue was annealed in a diffusion furnace under an oxygen atmosphere to a temperature of 800° C. for seventy minutes including a five minute push into the furnace and a five minute pull out of the furnace. These actions completed the process of FIG. 3 through step P78.

Platinum metal was sputtered as top electrode 28 to a 1000 Å thickness of platinum over layer 26. A photoresist was applied and ion etched according to conventional protocols including removal of the resist. The patterned device was annealed in a diffusion furnace under an oxygen atmosphere at 800° C. for thirty minutes including a five minute push into the furnace and a five minute pull out of the furnace. These actions completed the process of FIG. 3 through step P88, and provided a ferroelectric capacitor of the type depicted in FIG. 1 having strontium bismuth tantalate as layer 26.

This process was repeated in an identical manner, except a standard SOG solution from General Chemical of Parisippane, N.J., was substituted for the precursor of Example 2 in step P66. The liquid SOG was applied while spinning the substrate at 3000 rpm in the spin-coater machine. The precursor of Example 2 continued to be used in step P74.

EXAMPLE 4

Formation of Ferroelectric Capacitors Using a Temporary Capping Layer and without Coating an Annealed Bottom Electrode with Additional Platinum Metal A wafer including strontium bismuth tantalate capacitors of the type depicted in FIG. 1 was produced according to a different method than that of FIG. 3. The procedure was identical to that of Example 3, with these exceptions: (1) a 2000 Å thickness (not 1000 Å) of platinum was sputtered as first noble metal portion 36 in step P64; and (2) step P72 was never performed. Thus, the final product appeared identical to that of FIG. 1, but the 2000 Å thicknesses of bottom electrode platinum comprising portions 36 and 40 were deposited as a single layer. In the first capacitor, layer 59 of FIG. 4 was deposited as strontium bismuth tantalate and removed (steps P66–P70), as in Example 3. In a second capacitor prepared according to this revised method, layer 59 was deposited as SOG and removed, as in Example 3.

EXAMPLE 5

Formation of Ferroelectric Capacitors without Using A Temporary Capping Layer and without Coating an Annealed Bottom Electrode with Additional Platinum Metal A wafer including ferroelectric capacitors of the type depicted in FIG. I was produced according to a different method than that of FIG. 3. The procedure was identical to that of Example 3, with these exceptions: (1) a 2000 Å thickness (not 1000 Å) of platinum was sputtered as first noble metal portion 36 in step P64; and (2) steps P66, P70, and P72 were never performed. In this manner, the bottom electrode formed of 100 Å Ti and 2000 Å Pt was preannealed at 600° C. for thirty minutes in oxygen, but no temporary capping layer 59 (FIG. 4) was deposited.

An additional wafer was produced by a process that also included skipping step P68, i.e., bottom electrode 24 was not preannealed before deposition of the strontium bismuth tantalate liquid precursor.

EXAMPLE 6

Scanning Electron Microscope Comparison of Bottom Electrode Surface Irregularity Features Samples that derived from Examples 3, 4, and 5 were partially repeated to provide a substrate that presented an exposed bottom electrode 24. Example 3 was repeated through step P70 using the strontium bismuth tantalate precursor solution to form layer 59 (FIG. 4), which was removed in step P70. Example 4 was likewise repeated through step P70. Example 5 was repeated through step P68 for the preannealed sample, and through step P64 for the non-preannealed sample.

Figure 7:
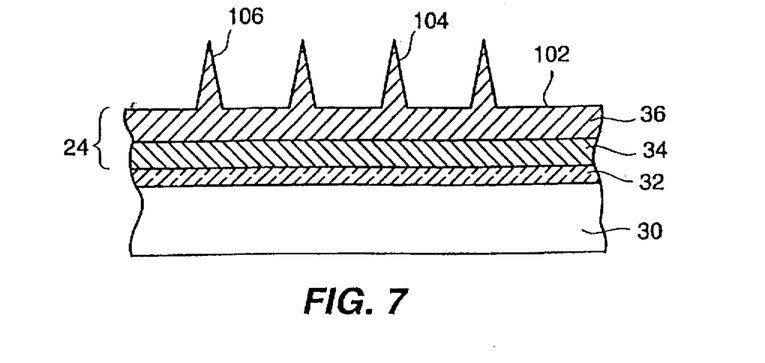
FIG. 7 depicts a faulty bottom electrode structure having large hillock structures on its uppermost surface.

A scanning electron microscope ("SEM") was used to view the bottom electrode surface structures of the respective samples at a magnification of about 40,000X. FIG. 7 schematically depicts the SEM results for the preannealed sample of Example 5. Uppermost surface of bottom electrode 24 was covered with sharp, irregularly spaced, upwardly pointing hillocks, e.g., hillocks 104 and 106, which rose above surface 102 for a distance of approximately 900 Å. These hillocks were caused by different relative rates of thermal contraction between bottom electrode 24 and the underlying substrate. The respective layers expanded upon heating. Upon cooling, the contraction of layers 32 and 34 was greater than the contraction of metalization portions 34 and 36. Portion 34 adhered to layer 32, and the resultant interlayer stresses induced the formation of hillocks.

Thin film ferroelectric or dielectric layers are intended to be liquid-deposited on surface 102 as layer 26. These films will preferably range in thickness from 500 Å to 3000 Å.

Hillocks like hillocks 102 and 104 serve to reduce process yields by shorting across layer 26 and, further, present long term device reliability problems.

No sharp hillocks were observed in the other samples. Some surface irregularities were observed, i.e., small, rounded features, but these features were estimated to rise less than about 50 Å to 80 Å above surface 102. These smaller rolling structures are negligible because they pose no serious threat to device performance, i.e., the electrodes of Examples 3 and 4 are essentially free of hillocks.

EXAMPLE 6

Comparative Evaluation of Capacitor Devices

The wafers from Examples 3, 4, and 5 included a ferroelectric $SrBi_2Ta_2O_9$ material of approximately 1800 Å in thickness. Selected capacitors from each wafer were subjected to polarization hysteresis measurements on an uncompensated Sawyer-Tower circuit including a Hewlitt Packard 3314A function generator and a Hewlitt Packard 54502A digitizing oscilloscope. Measurements were obtained at 20° C. using a sine wave function having a frequency of 10,000 Hz and voltage amplitudes of 0.25, 0.5, 1.0, 1.5, 2.0, 2.5, 3.0, 4.0, 5.0, and 7.0V.

Figure 8:
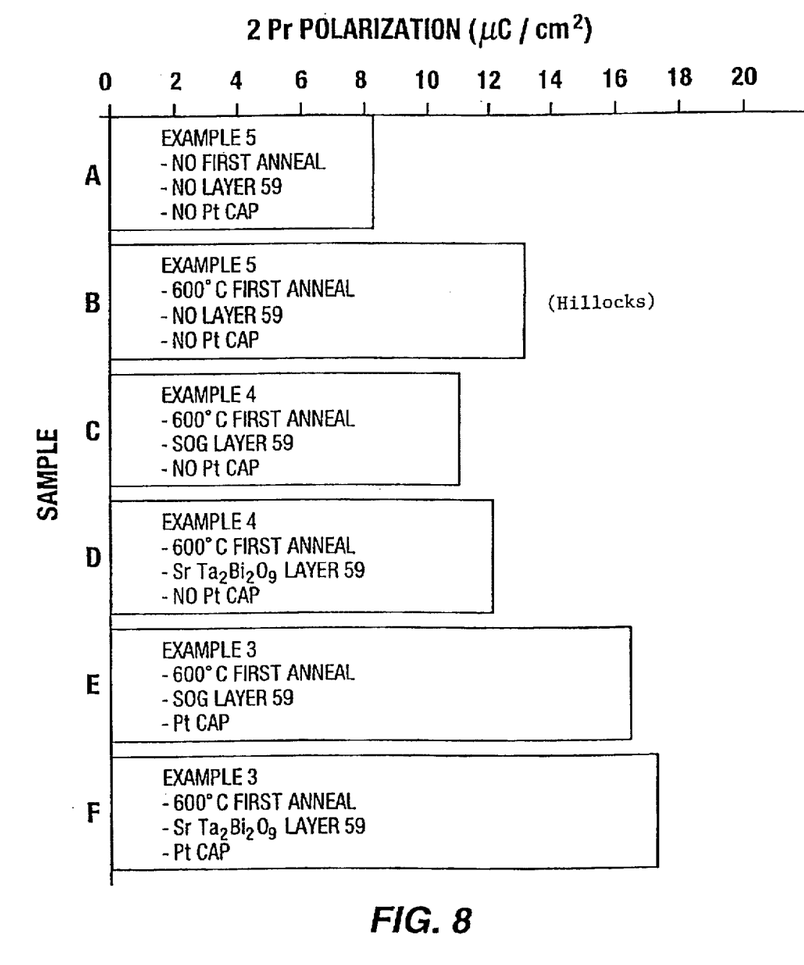
FIG. 8 is a bar graph comparing average polarization values obtained from capacitors that were processed under different conditions.

FIG. 8 depicts a bar graph of the 2Pr polarization values (in $\mu C/cm^2$) that were obtained for 3V switching measurements. Each bar represents a three point average of data obtained from selected capacitors on a given wafer. Each bar has been labeled with a corresponding letter, A, B, C, D, E, and F, as well as descriptive information for easy reference to identify the sample. Differences between bars A and B indicate that the first anneal in oxygen provided an approximate 60% improvement in polarization with respect to bar A. It is believed that the polarization of bar B was improved because titanium from the 200 Å portion 34 diffused through the overlying platinum metal to form titanium oxide on surface 102 (FIG. 4) during the first 600° C. anneal of step P68. The titanium oxide on surface 102 acted as a diffusion barrier region to improve the polarization the sample that produced bar B.

The respective polarizations of bars C and D were less than that of bar B, but represent an approximate 40% improvement with respect to bar A. It is theorized that the samples which produced bars C and D contained no titanium oxide surface coating, but the use of temporary layer 59 reduced the level of titanium contamination in ferroelectric layer 26 by abruptly truncating a diffusion gradient. Additionally, bar D is about 9% greater than bar C, which indicates that it is more effective to use strontium bismuth tantalate for layer 59.

Bars E and F represent the greatest overall polarization, and an approximate 110% improvement with respect to bar A.

The foregoing discussion can be utilized to provide less preferred variations of the present invention. For example, the adhesion metal can include titanium oxide, tantalum, tantalum oxide, or other known adhesion metals. Layer 26 may actually be formed of a plurality of different layers, and not all such layers must necessarily be metal oxides. Furthermore, the geometries and relative thicknesses that are depicted in FIGS. 1, 2, 4, and 5 are presented for illustrative purposes only. These figures are not intended to reflect scale models of the actual materials which may vary considerably in geometry and thickness.

Those skilled in the art will understand that the preferred embodiments, as described above, may be subjected to apparent modifications without departing from the true scope and spirit of the invention. Accordingly, the inventors hereby state their intention to rely upon the Doctrine of Equivalents for purposes of protecting their full rights in the invention.

We claim:

1. A thin-film electrode device for use in integrated circuits, comprising:

a substrate;

a bottom electrode supported by said substrate and including an interdiffusion region including a stabilized lattice having a mixture of annealed adhesion metal and noble metal moieties, said mixture of annealed adhesion metal and noble metal moieties produced according to a method including the steps of depositing of an adhesion metal layer on said substrate, a noble metal layer on said adhesion metal layer, and a temporary capping layer on said noble metal layer, thereafter annealing said adhesion metal layer, said noble metal layer, and said temporary layer, in simultaneous fashion, and thereafter removing said temporary layer; and a noble metal capping layer produced by depositing said noble metal capping layer over said region after said annealing step.

2. The device as set forth in claim 1, said bottom electrode having an abrupt change in a diffusion gradient for said adhesion metal through said interdiffusion region, said abrupt change characterized by being caused by said step of removing said temporary layer from a surface of said interdiffusion region.

3. The device as set forth in claim 2, said substrate including an isolation layer adjoining said bottom electrode.

4. The device as set forth in claim 1, said bottom electrode interdiffusion region having a first average concentration of at least one diffusible moiety selected from the group consisting of adhesion metal moieties, substrate moieties, and mixtures thereof, said noble metal capping layer having a second average concentration of said diffusible moiety less than said first average concentration.

5. The device as set forth in claim 4, said diffusible moiety being titanium adhesion metal.

6. The device as set forth in claim 5, said noble metal moieties of said interdiffusion region and said noble metal capping layer both including an identical type of noble metal.

7. The device as set forth in claim 6, said noble metal moieties of said interdiffusion region and said noble metal capping layer both including platinum.

8. The device as set forth in claim 1, said adhesion metal moieties of said interdiffusion region including titanium.

9. The device as set forth in claim 1, said adhesion metal moieties of said interdiffusion region including tantalum.

10. The device as set forth in claim 1, said interdiffusion region consisting essentially of platinum and titanium.

11. The device as set forth in claim 1, said noble metal capping layer consisting essentially of platinum.

12. The device as set forth in claim 1, further including:

a metal oxide layer opposite said substrate across said noble metal capping layer and said interdiffusion region, said metal oxide layer including a metal oxide material selected from the group consisting of ferroelectric metal oxides, dielectric metal oxides having a dielectric constant greater than or equal to that of silicon dioxide, and combinations thereof; and a top electrode opposite said first noble metal capping layer across said second metal oxide layer.

13. The device as set forth in claim 12, said metal oxide layer including a barium strontium titanate material.

14. The devices as set forth in claim 13, said barium strontium titanate material being essentially free of silicon and silicon dioxide.

15. The device as set forth in claim 14, said barium strontium titanate material including an average empirical formula of $Ba_{0.7}Sr_{0.3}TiO_3$.

16. The device as set forth in claim 12, said metal oxide layer including a layered superlattice material compound.

17. The device as set forth in claim 16, said layered superlattice material compound including strontium bismuth tantalate.

18. The device as set forth in claim 17, said strontium bismuth tantalate material including an average empirical formula of $SrBi_2Ta_2O_9$.

19. A device produced according to a method comprising the steps of:

depositing titanium metal on a substrate:

depositing a platinum metal on said adhesion layer;

interdiffusing said titanium metal and said platinum metal to provide a barrier region by heating said adhesion metal portion end said noble metal portion to a first anneal temperature ranging from 450° C. to 850° C.;

cooling said diffusion barrier region to stabilize a lattice therein; thereafter amassing a noble metal layer upon said diffusion barrier layer;

forming a temporary layer on said noble metal layer by contacting said noble metal layer with a liquid precursor solution to form a thin precursor film, said liquid precursor solution having a plurality of metal moieties in effective amounts for yielding a metal oxide layered superlattice material upon thermal treatment in an oxygen atmosphere, and annealing said thin precursor film to yield said metal oxide by heating said thin precursor film in oxygen to a temperature ranging from about 600° C. to about 850° C.;

removing said temporary layer; and forming a layered superlattice material metal oxide material on said second noble metal layer after removal of said temporary layer.

20. The device as set forth in claim 19, wherein said device has a 3V polarization potential of at least about 40% greater than an identical device prepared without said forming and removing steps.

* * * * *